(12) United States Patent
Ohta

(10) Patent No.: US 6,518,627 B1
(45) Date of Patent: Feb. 11, 2003

(54) SEMICONDUCTOR DEVICE AND METHOD OF MANUFACTURING THE SAME

(75) Inventor: Ken Ohta, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/658,408

(22) Filed: Sep. 8, 2000

(30) Foreign Application Priority Data

Sep. 9, 1999 (JP) .............................. 11-255962

(51) Int. Cl.[7] .................................................. H01L 29/76
(52) U.S. Cl. ........................................ 257/365; 257/306
(58) Field of Search ................................. 257/365, 306; 365/149

(56) References Cited

U.S. PATENT DOCUMENTS 5,371,701 A * 12/1994 Lee et al. .................... 365/149
5,463,236 A * 10/1995 Sakao ......................... 257/306
5,801,079 A * 9/1998 Takaishi ...................... 438/396
5,804,851 A * 9/1998 Noguchi et al. ............. 257/304

* cited by examiner

Primary Examiner—Richard Elms
Assistant Examiner—Douglas Menz
(74) Attorney, Agent, or Firm—Young & Thompson

(57) ABSTRACT

A resistive element is formed on a gate insulating film while forming a gate electrode of a MOS transistor forming a memory cell. An interlayer insulating film is formed on the resistive element. A capacitive insulating film is formed on the interlayer insulating film. Wiring is formed on the insulating film. The first parasitic capacitance between the resistive element and the substrate is greater than second parasitic capacitance between the resistive element and the wiring. The gate electrode formed with high accuracy in resistivity, resulting in the resistive element with high accuracy in resistivity. Further, even if a couple noise is applied to the resistive element from the wiring through second parasitic capacitance, the noise is absorbed by the first parasitic capacitance.

5 Claims, 9 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and, more particularly, to a semiconductor device including a resistive element and a method of manufacturing the same.

2. Description of the Related Art

A DRAM (Dynamic Random Access Memory) is a well known type of semiconductor device. A DRAM includes a resistive element for generating a predetermined voltage to various parts inside the device. This resistive element is connected between a source potential VDD and a ground potential GND, and a voltage therebetween is divided by the resistive element to generate a necessary voltage. The resistive element has high resistance to restrict the electric power to be consumed. For example, the resistive element is formed of a polycrystalline silicon film, and formed at the same time a plate electrode of a capacitive element included in the DRAM is formed.

FIGS. 7 to 10 illustrate a DRAM including a resistive element. FIG. 7 is a plan view showing the structure of the DRAM. FIG. 8 is a cross sectional view taken along a line C—C of FIG. 7. FIG. 9 is a diagram showing an equivalent circuit of the DRAM. FIG. 10 is a cross sectional view showing the structure of the DRAM.

As illustrated in FIGS. 7 and 8, the DRAM includes a resistive element 54 in a resistive element formation area on a P-type silicon substrate 51. The resistive element 54 is formed of polycrystalline silicon, and is formed while forming a plate electrode (upper electrode) of a capacitive element 60 (to be described later) included in a DRAM.

One end of the resistive element 54 is connected to a source potential VDD, and the other end thereof is connected to a ground potential GND. An intermediate terminal 55 for outputting an intermediate potential HVDD is formed at one point of the resistive element 54.

As shown in FIG. 10, the capacitive element 60 is formed in a transistor formation area of the P-type silicon substrate 51 on which the resistive element 54 is also formed.

The capacitive element 60 includes a storage electrode (lower electrode) 65 formed in a contact hole 68 formed in a first interlayer insulating film 52, a capacitive insulating film 66, and a plate electrode (upper electrode) 67 which is formed of a polycrystalline silicon film and formed on the capacitive insulating film 66. P$^+$-type well area 61 is formed in the P-type silicon substrate 51. N$^+$-type areas 62 and 63 are formed in the P$^+$-type well area 61.

In such a DRAM, as illustrated in FIG. 9, a parasitic capacity C is formed from the resistive element 54, wiring 57 formed adjacent to the resistive element 54, and the interlayer insulating film 56. The intermediate potential HVDD is output from the intermediate terminal 55. The intermediate potential HVDD is obtained by dividing a voltage between the source potential VDD and the ground potential GND by the first resistance R1 and the second resistance R2 of the resistive element 54.

In the DRAM, the resistive element 54 is formed while forming the plate electrode of the capacitive element 60. The resistive element 54 has the resistance substantially with the same accuracy as that of the plate electrode 67 of the capacitive element 60, thus causing the following problems.

First, the accuracy of the resistance of the resistive element 54 is low, therefore, it is difficult to generate a predetermined voltage with high accuracy. More specifically, the plate electrode 67 is formed to have resistivity with not high level of accuracy, resulting in a large variation in the resistivity. This causes a large variation in the resistivity of the resistive element 54 formed while the plate electrode 67 is formed. The resistive element 54 having resistivity with low accuracy, thus it is difficult to generate a predetermined voltage accurately.

Second, the resistive element 54 is small in size and is formed of a layer having high resistivity. Thus, the potential of the resistive element 54 may largely vary on an influence of a couple noise, resulting in inappropriate operations of the semiconductor device.

SUMMARY OF THE INVENTION

It is accordingly an object of the present invention to provide a semiconductor device, including a resistive element which is not influenced by a noise from wiring, and a method of manufacturing the same.

Another object of the present invention is to provide a semiconductor device including a resistive element having resistivity with high accuracy.

In order to achieve the above objects, there is provided a method of manufacturing a semiconductor device, the method comprising:

forming an insulating film on a substrate having a resistive element formation area and a transistor formation area;

forming a conductive layer on the insulating film;

patterning the conductive layer, thereby to form a resistive element in the resistive element formation area and a gate electrode in the transistor formation area, respectively;

doping an impurity in the substrate while using the resistive element and the gate electrode as masks to form a doped layer in the resistive element formation area, and a source area and a drain area in the transistor formation area;

forming an interlayer insulating film on the resistive element and the gate electrode; and forming wiring on the interlayer insulating film.

BRIEF DESCRIPTION OF THE DRAWINGS

The objects and other objects and advantages of the present invention will become more apparent upon reading of the following detailed description and the accompanying drawings in which.

DETAILED DESCRIPTION OF THE PREFERRED EMBODIMENTS

Preferred embodiments of this invention will now be explained with reference to the accompanying drawings.

First Embodiment

Figure 1:
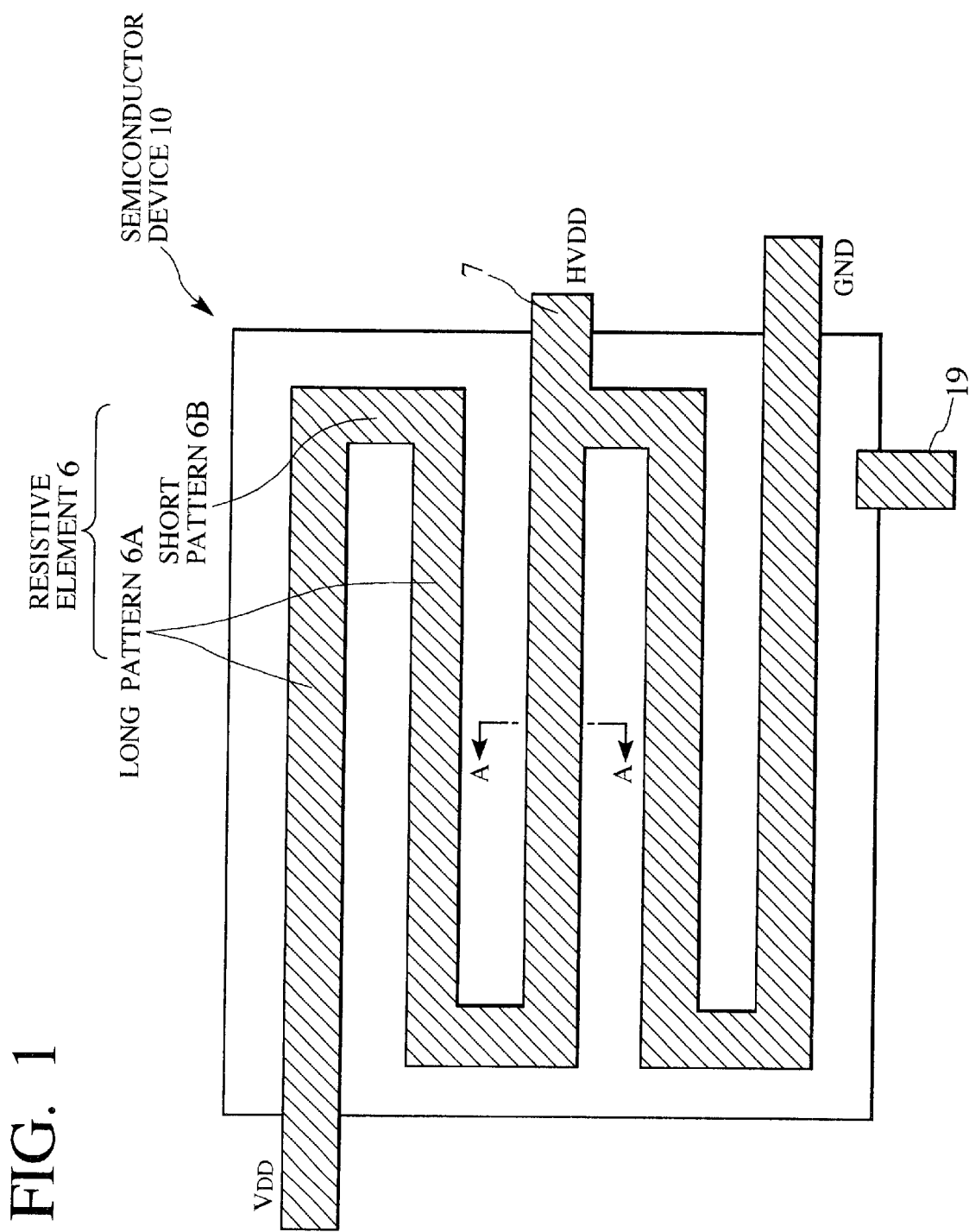
FIG. 1 is a plan view showing the structure of a semiconductor device according to the first embodiment of this invention.

As shown in FIG. 1, a semiconductor device 10 according to the first embodiment includes a resistive element 6 on a P-type silicon substrate 1.

The resistive element 6 comprises a long pattern 6A and a short pattern 6B. The long pattern 6A is arranged in a longitudinal direction. The short pattern 6B is connected to and adjoins one end of the long pattern 6A, and is so arranged that the long pattern is reversed. The resistive element 6 includes the continuous patterns of the long pattern 6A and the short pattern 6B, and the length of the resistive element 6 is so set as to have predetermined resistance. One end of the resistive element 6 is connected to a source potential VDD, while the other end thereof is connected to a ground potential GND. Arranged on one point of the resistive element 6 is an intermediate terminal 7 for outputting an intermediate potential HVDD.

Figure 2:
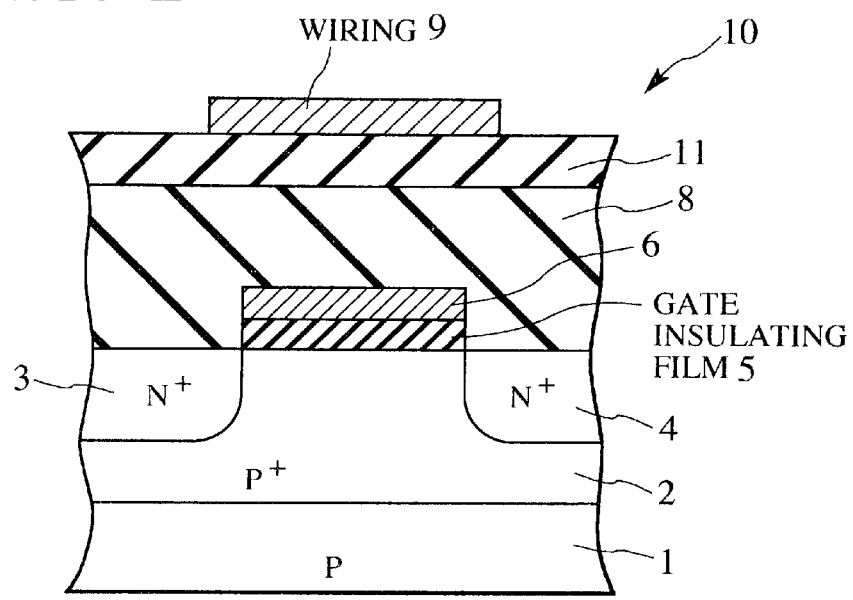
FIG. 2 is a cross sectional view taken along a line A—A of FIG. 1.

As shown in FIG. 2, a $P^+$-type well area 2 is formed in the P-type silicon substrate 1. The resistive element 6 is formed on the $P^+$-type well area 2 via an insulating film 5. $N^+$-type areas 3 and 4, which surround the resistive element 6 and the insulating film 5 and leave the $P^+$-type well area 2 facing the resistive element 6, are formed in the P-type silicon substrate 2.

The resistive element 6 is formed together with gate electrodes of MOS transistors which serve as access transistors of memory elements to be described later, the insulating film 5 is formed together with gate insulating films of the MOS transistors, and $N^+$-type areas 3 and 4 are formed together with source and drain areas of the MOS transistors.

An interlayer insulating film 8 is formed on the resistive element 6. A capacitive insulating film 11 is formed on the interlayer insulating film 8. Wiring 9 is formed adjacent to the resistive element 6 via the insulating film (8, 11). A ground terminal 19 connects the $N^+$-type areas 3 and 4 with the P-type well area 2.

Figure 3:
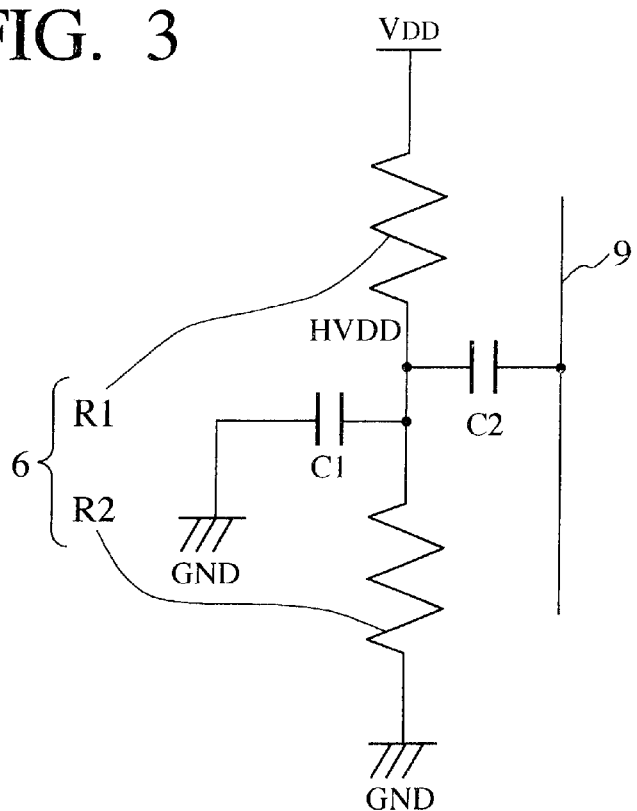
FIG. 3 is a diagram showing an equivalent circuit of the semiconductor device according to the first embodiment of this invention.

In the semiconductor device 10, as illustrated in FIG. 3, a parasitic capacity C2 is formed between the resistive element 6 and the wiring 9 adjoining the resistive element 6 via the interlayer insulating film 8. A parasitic capacity C1 is also formed between the resistive element 6 and the silicon substrate 1 via the gate insulating film 5. The intermediate potential HVDD which is a voltage obtained by dividing a voltage between the source potential VDD and the ground potential GND by the first resistance R1 and the second resistance R2 of the resistive element 6, is output from the intermediate terminal 7.

The thickness of the insulating film 5 is equal to or smaller than 10 nm. The thickness of the interlayer insulating film 8 is several hundred nano meters, i.e., several ten times larger than the thickness of the insulating film 5. Therefore, as compared with the parasitic capacity C2, the parasitic capacity C1 can be made large.

The large parasitic capacity C1 absorbs the couple noise from wiring 9 to the resistive element 6. Hence, the intermediate potential HVDD does not remarkably vary. Further, even if a noise reaches the source potential VDD or the ground potential GND, the noise is also absorbed. For example, in the case where a sharp noise reaches the source potential VDD, the large parasitic capacity C1 absorbs the noise in accordance with a time constant which can be expressed with a product of the resistance R1 and the parasitic capacity C1. Hence, the intermediate potential HVDD does not remarkably vary. In the case where a sharp noise reaches the ground potential GND, the parasitic capacity C1 absorbs the noise in accordance with a time constant which can be expressed with a product of the resistance R2 and the parasitic capacity C1. Hence, the intermediate potential HVDD does not remarkably vary.

A method of manufacturing the semiconductor device according to the first embodiment will now sequentially be explained with reference to FIGS. 4A to 4F.

Figure 4A:
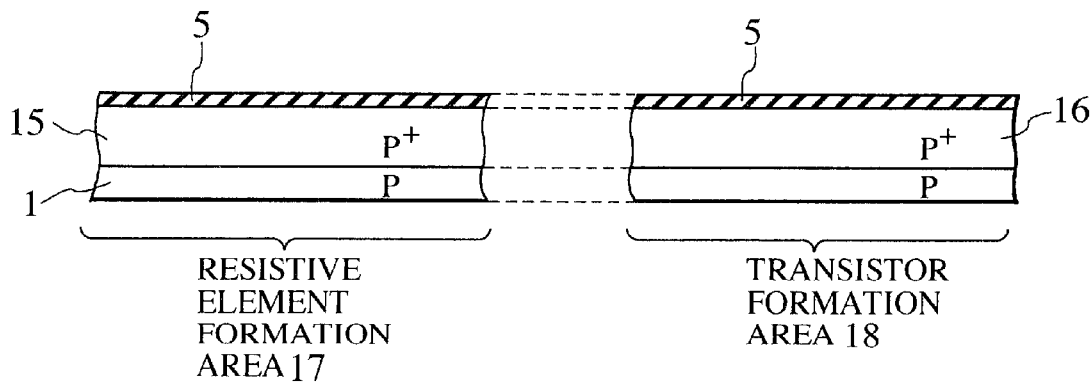
FIGS. 4A to 4F are process diagrams each showing a process of manufacturing the semiconductor device according to the first embodiment of this invention.

As shown in FIG. 4A, ions of P-type impurities are implanted into the P-type silicon substrate 1, thereby forming the first P-type well area 15 and the second P-type well area 16. The first P-type well area 15 and the second P-type well area 16 are formed in a resistive element formation area 17 for forming the resistive element 6 and a transistor formation area 18 for forming a MOS transistor, respectively. Subsequently, the gate insulating film 5 made of silicon oxide which is almost equal to or smaller than 10 nm in thickness is formed on the surfaces of the first and second P-type well areas 15 and 16 with a thermal oxidation technique.

Figure 4B:
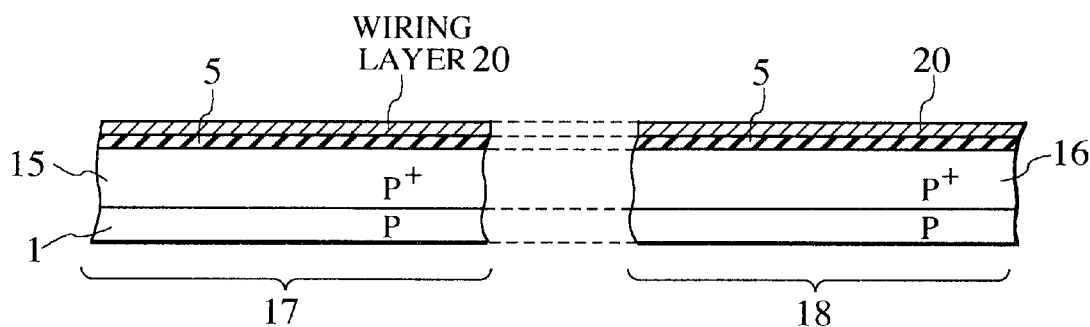

As shown in FIG. 4B, a wiring layer 20 which is formed from a polycrystalline silicon film is formed on the entire surface of the resultant structure with a CVD (Chemical Vapor Deposition) technique. The resistivity of the wiring layer 20 is controlled with high accuracy by doping desired impurities.

Figure 4C:
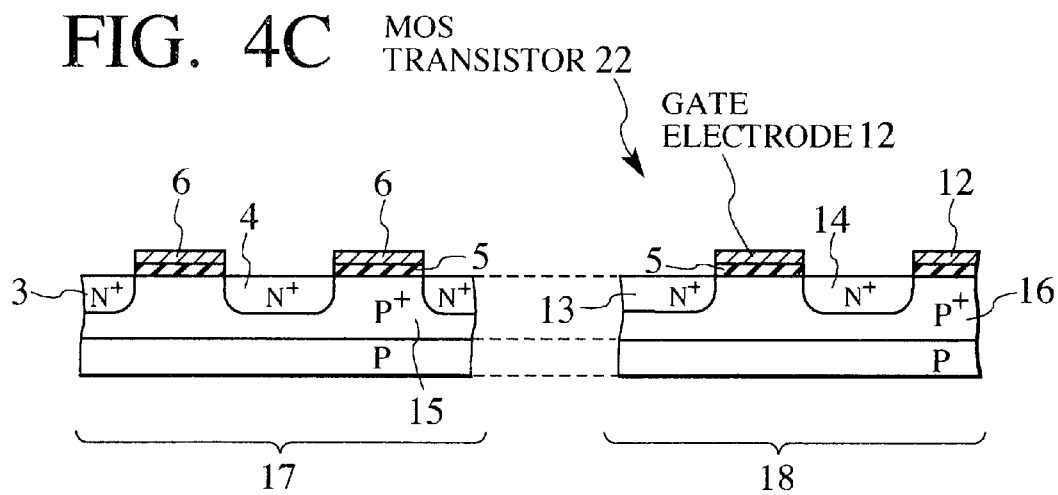

As illustrated in FIG. 4C, the wiring layer 20 and the gate insulating film 5 are patterned in a desired shape, and the resistive element 6 is formed in the resistive element formation area 17, using a photolithography technique. At the same time, a gate electrode 12 and word line (not shown) are formed in the transistor formation area 18. Then, N-type impurities is implanted into the substrate with the resistive element 6 and the gate electrode 12 as masks, thereby forming the $N^+$-type areas 3 and 4 in the first P-type well area 15, and $N^+$-type areas 13 and 14, which are to be source and drain areas in the second P-type well area 16, in a self-aligned fashion to the resistive element 6 and the gate electrode 12. Accordingly, a MOS transistor 22 which serves as an access transistor of a memory cell is formed in the transistor formation area 18.

Figure 4D:
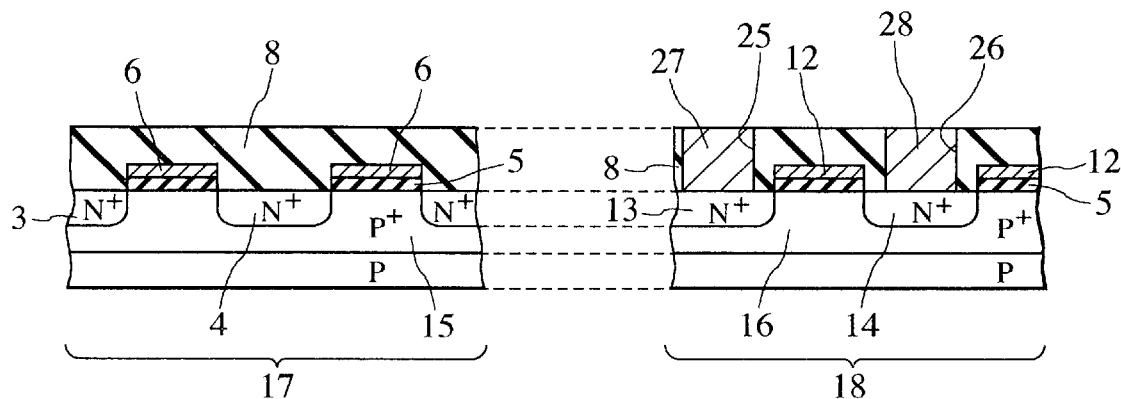

As shown in FIG. 4D, an interlayer insulating film 8 made of silicon oxide which is almost 100 nm in thickness is formed on the entire surface on the resultant structure, using a CVD technique. Subsequently, using the photolithography technique, contact holes 25 and 26 are formed respectively on the $N^+$-type areas 13 and 14, serving as source and drain areas of the MOS transistor 22. Thereafter, with the CVD technique, the contact holes 25 and 26 are filled with conductive materials, thereby forming a bit line leading layer 27 and a plug conductor layer 28.

Figure 4E:
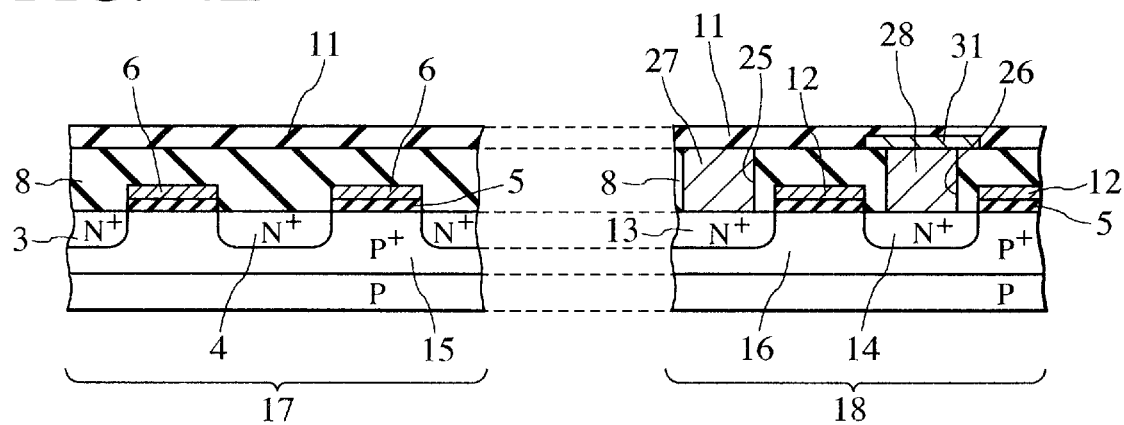

As shown in FIG. 4E, a wiring layer is formed, then the wiring layer is patterned in a desired shape using the photolithography technique to form a storage electrode (lower electrode) 31 connected to the plug conductive layer 28. After this, a capacitive insulating film 11 is formed on the entire surface of the resultant structure. This capacitive insulating film 11 may be formed of arbitrary dielectric materials depending on the purpose of its use.

Figure 4F:
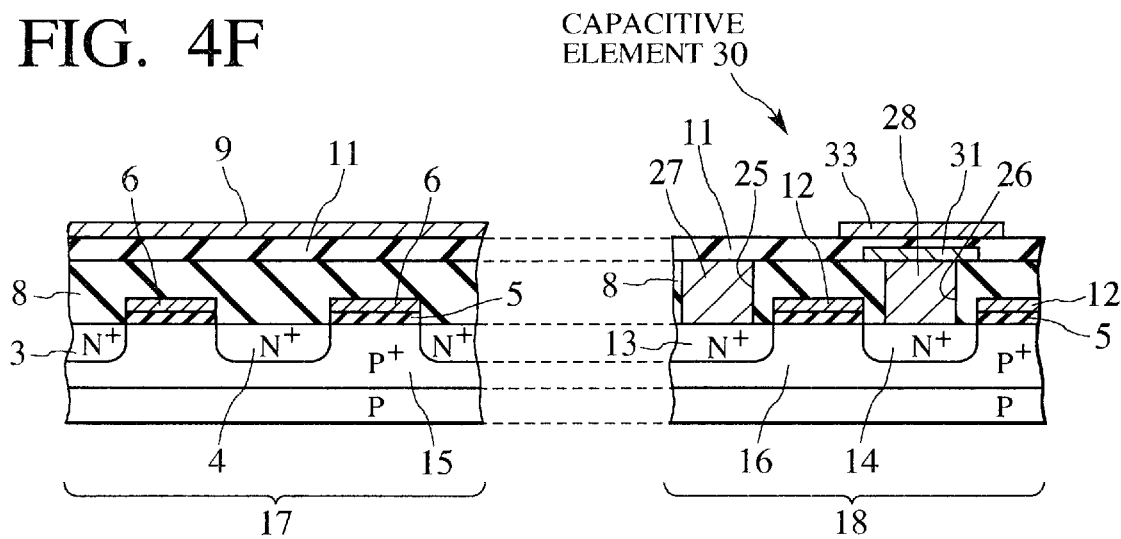

As illustrated in FIG. 4F, a wiring layer is formed with the CVD technique, and it is patterned in a desired form with the photolithography technique to form the wiring 9 adjoining the resistive element 6 in the resistive element formation area 17 and a plate electrode (upper electrode) 33 in the transistor formation area 18.

A capacitive element 30 is formed with lower electrode 28 and 31, and upper electrode 33 and capacitive insulating film 11 therebetween. A MOS transistor 22 is formed of gate electrode 12, gate insulating film 5, and source and drain areas 13 and 14. The capacitive element 30 and the MOS transistor 22 form a memory cell of a DRAM in combination.

As explained above, according to the method of manufacturing the semiconductor device of the first embodiment, the resistive element 6 and gate electrode 12 are formed with the same manufacturing processes. Accordingly, the resistive element 6, which is formed of the same material as that of the gate electrode 12 with the same thickness and crystal quality as those of the gate electrode 12, and also whose resistivity is controlled with the same accuracy as that of the gate electrode 12, can be manufactured.

The resistivity of gate electrode 12 is controlled with high accuracy. Therefore, the resistivity of the resistive element 6 is also controlled with high accuracy, therefore, a predetermined voltage can be generated by the resistive element 6. For example, the deviation of the sheet resistance of the resistive element 6, which was formed while forming the gate electrode 12, could be controlled down to approximately one third of the deviation of the sheet resistance of a resistive element 54, which was formed while forming a plate electrode 67 of a conventional capacitive element 60.

Second Embodiment

Figure 5:
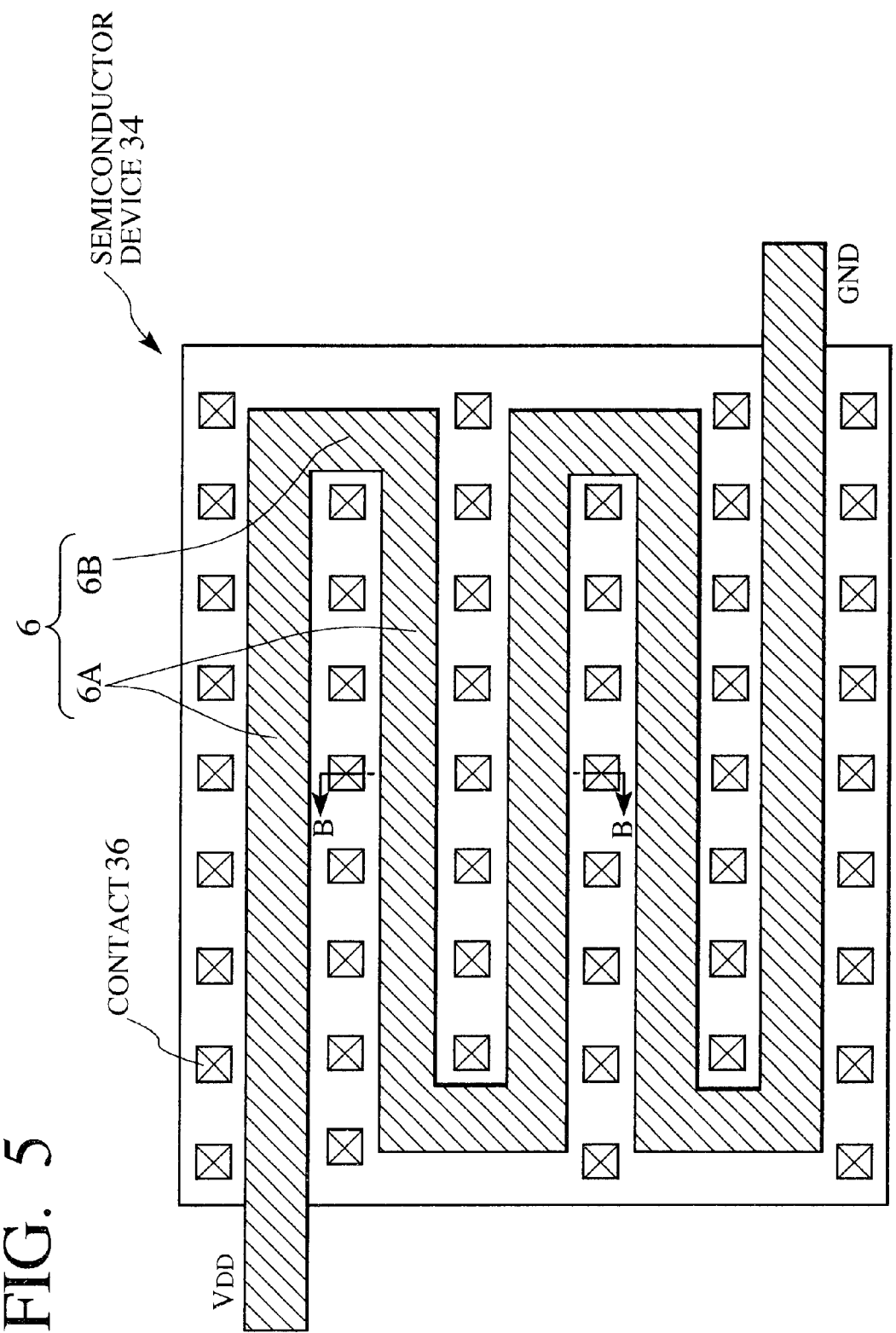
FIG. 5 is a plan view showing the structure of the semiconductor device according to the first embodiment.
Figure 6:
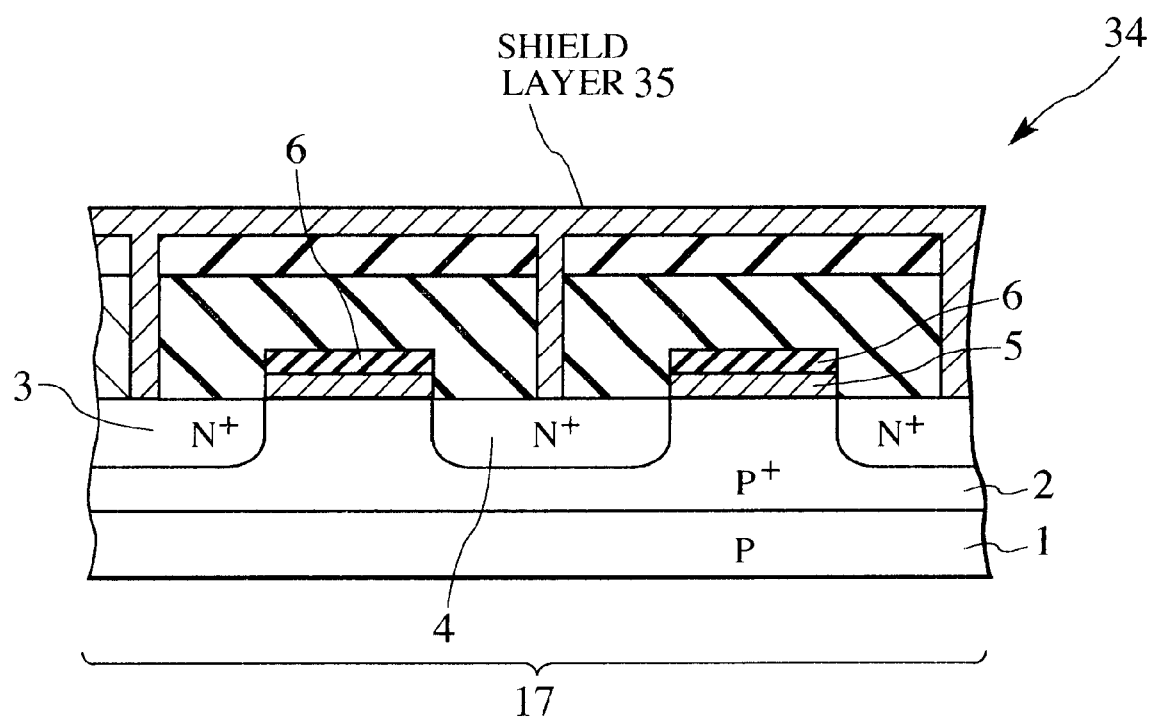
FIG. 6 is a cross sectional view taken a line B—B of FIG. 5.
Figure 7:
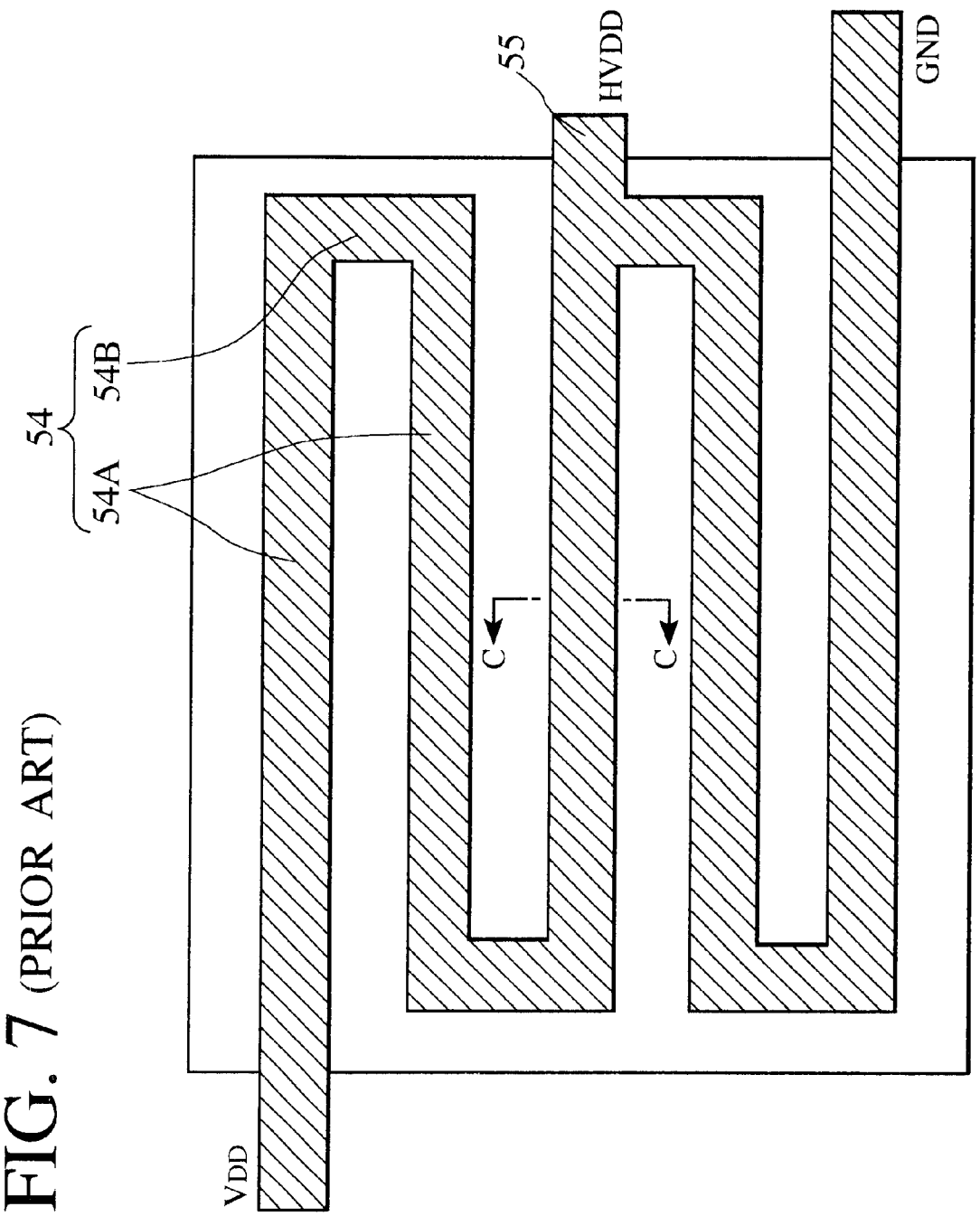
FIG. 7 is a plan view showing the structure of a conventional semiconductor device.
Figure 8:
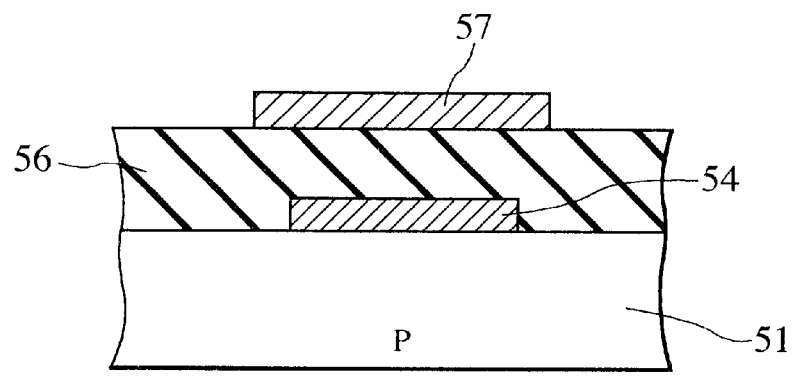
FIG. 8 is a cross sectional view taken along a line C—C of FIG. 7.
Figure 9:
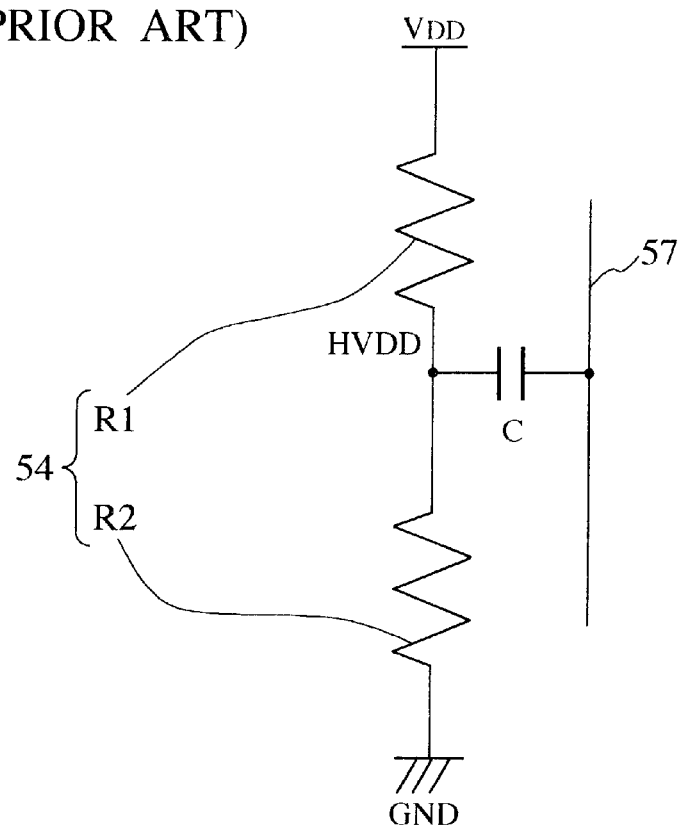
FIG. 9 is a diagram showing an equivalent circuit of the conventional semiconductor device.
Figure 10:
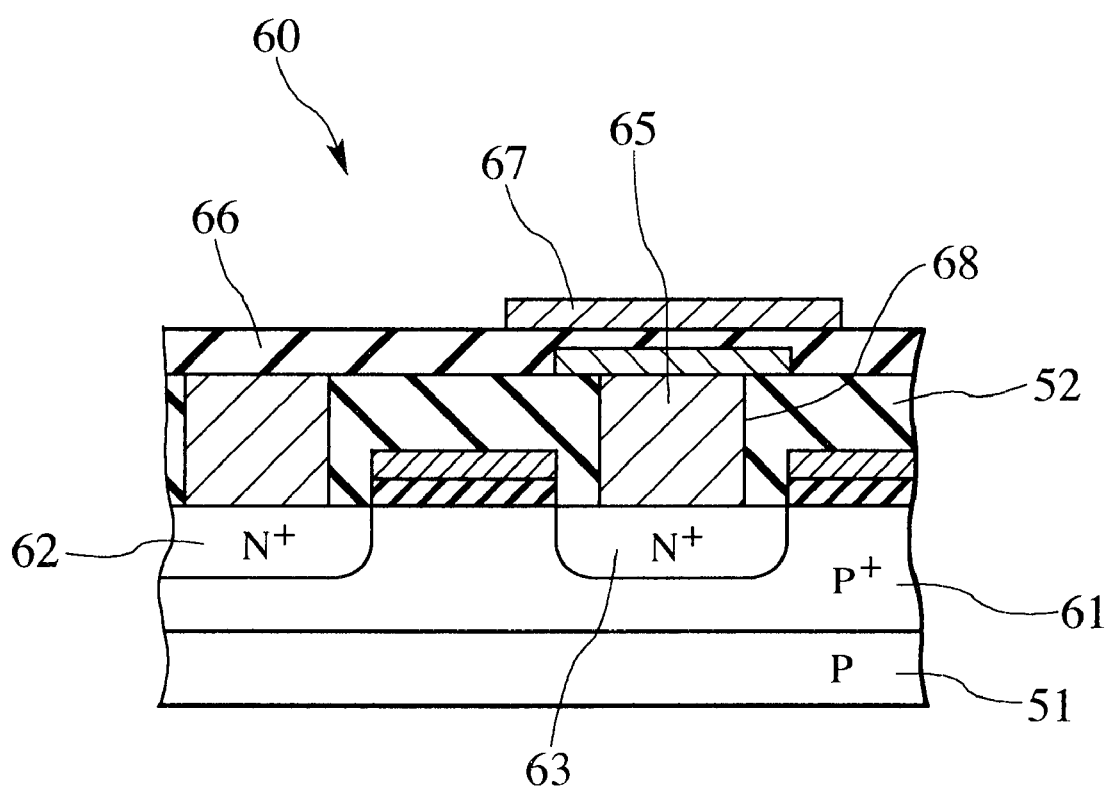
FIG. 10 is a cross sectional view showing the structure of a conventional semiconductor device.

In FIGS. 5 and 6, the same reference numerals are used for the same components as those in the semiconductor device according to the first embodiment.

As shown in FIGS. 5 and 6, in a semiconductor device 34 according to the second embodiment, a shield layer 35 including a polycrystalline silicon film covers the resistive element 6 in the resistive element formation area 17. This shield layer 35 is connected to the N$^+$-type areas 3 and 4 on the P-type silicon substrate 1 via contacts 36. The shield layer 35 is formed in a process of forming a transistor of a memory cell in the transistor formation area 18.

The shield layer 35 is connected to the N$^+$-type areas 3 and 4 via the contacts, the same potential as the substrate potential is applied to the shield layer 35. Thus, the resistive element 6 can effectively be shielded. The forming of the shield layer 35 does not require any special process, thus maintaining the throughput of the semiconductor device.

According to the structure of the semiconductor device of the second embodiment, the same effect and advantage as those obtained in the first embodiment can be realized. In addition, the resistive element 6 can be shielded.

The preferred embodiments of the present invention have been described with reference to the accompanying drawings. However, the present invention is not limited to the above embodiments, and various embodiments and changes may be made thereonto without departing from the broad spirit and scope of the invention.

For example, the layer forming the resistive element 6 and gate electrode 12 is not limited to polycrystalline silicon, and any conductive materials other than silicon can be employed for the conductive layer. The conductive type of each semiconductor area may be opposite to that employed in the above-described embodiments, i.e., the P-type area may be the N-type area and vice versa. The present invention is not limited to MOS transistors, and can be employed for MIS (Metal Insulator Semiconductor) transistors each including an insulating material in place of an oxide material. The conditions and materials of each semiconductor area, wiring layer and insulating layer are employed herein by way of example, thus can be changed to other form of conditions and materials as needed.

The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-255962 filed on Sep. 9, 1999, and including specification, claims, drawings and summary. The disclosure of the above Japanese Patent Application is incorporated herein by reference in its entirety.

What is claimed is:

1. A semiconductor device comprising:

a substrate;

a transistor including a gate insulating film formed on said substrate, a gate electrode formed on the gate insulating film, a source area and a drain area formed in said substrate;

an insulating layer formed of a same material as a material of the gate insulating film, said insulating layer being coplanar with the gate insulating film and formed on the substrate;

a resistive element formed of a same material as a material of the gate electrode and formed on the insulating layer, said resistive element and the gate electrode being coplanar;

an interlayer insulating film formed on said resistive element and said gate electrode; and wiring formed on said interlayer insulating film, wherein capacitance between the resistive element and the substrate via the insulating layer is greater than capacitance between the resistive element and the wiring via the interlayer insulating film.

2. The semiconductor device according to claim 1, wherein the gate electrode and said resistive element are formed of polycrystalline silicon.

3. The semiconductor device according to claim 1, wherein the gate electrode and said resistive element have resistivity substantially with same accuracy.

4. A semiconductor device having a resistive region adjacent to a transistor region, said device comprising:

a substrate having a source and a drain in the transistor region;

an insulating film formed on said substrate in both the resistive region and the transistor region, said insulating film being between the source and the drain in the transistor region;

a gate electrode formed on said insulating film in the transistor region;

a resistive element formed on said insulating film in the resistive region, said gate electrode and said resistive element being coplanar;

an interlayer insulating film formed on said gate electrode and said resistive element;

a first electrode formed on said interlayer insulating film, said first electrode being aligned with one of the source and the drain and being connected to said one of the source and the drain through a plug formed through the interlayer insulating film;

a capacitive insulating film formed over said first electrode and over said interlayer insulating film in the resistive region;

a second electrode formed on said capacitive insulating film in the transistor region; and a wiring layer formed on the capacitive insulating film in the resistive region, said wiring layer and said second electrode being coplanar, wherein a capacitance between said resistive element and said substrate is greater than a capacitance between said resistive element and said wiring layer.

5. The semiconductor device according to claim 4, wherein said gate electrode and said resistive element are polycrystalline silicon.

* * * * *